United States Patent [19]

Norell

[11] Patent Number: 5,303,618

[45] Date of Patent: Apr. 19, 1994

[54] VIA HOLE PUNCH

[76] Inventor: Ronald A. Norell, 1529 Tamarack, Carlsbad, Calif. 92008

[21] Appl. No.: 942,040

[22] Filed: Sep. 8, 1992

[51] Int. Cl.$^5$ ............................................... B21K 5/20
[52] U.S. Cl. .......................................... 76/107.1; 76/4
[58] Field of Search ................. 76/107.1, 4, 107.6; 83/691

[56] References Cited

U.S. PATENT DOCUMENTS

| | | | |
|---|---|---|---|
| 3,228,275 | 1/1966 | Taber | 76/107.1 |
| 3,477,317 | 11/1969 | Liander | 76/107.1 |
| 4,292,862 | 10/1981 | Thompson | 76/107.1 |

Primary Examiner—Roscoe V. Parker
Attorney, Agent, or Firm—Ralph S. Branscomb

[57] ABSTRACT

A punch die used to punch minute via holes in ceramic wafers used in integrated circuit construction is created by photoetching holes too small to be mechanically drilled into a pair of thin sheets that sandwich therebetween a thicker spacer slab having somewhat larger, mechanically drilled holes. A multiplicity of punch pins are then pressed into the three-layer sandwich and epoxied thereto to create an inexpensive a punch die which cooperates with a mechanically drilled die plate covered with a punch-pin receiving perforated skin, the holes in which being created in a similar photoetching process.

15 Claims, 1 Drawing Sheet

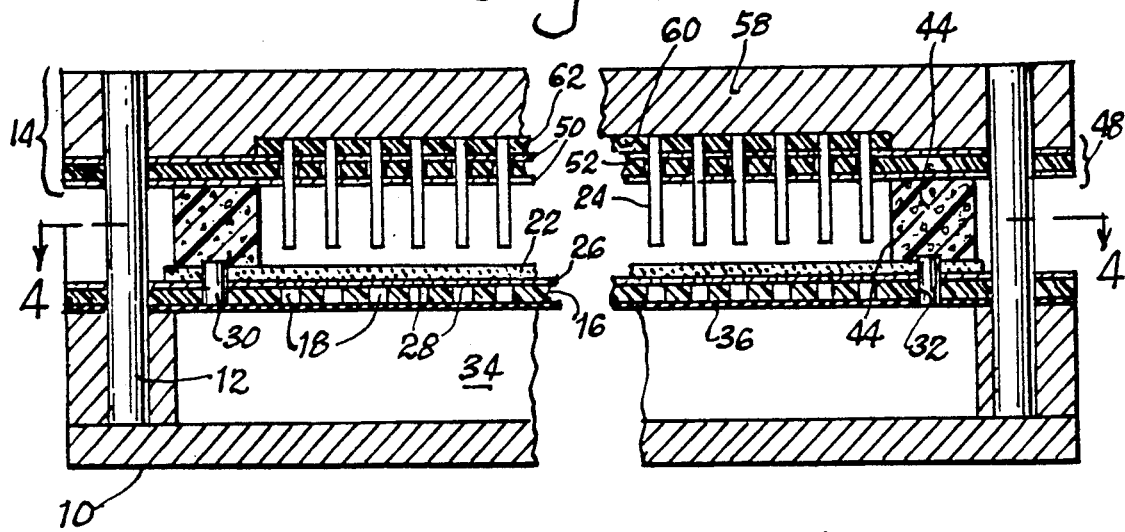
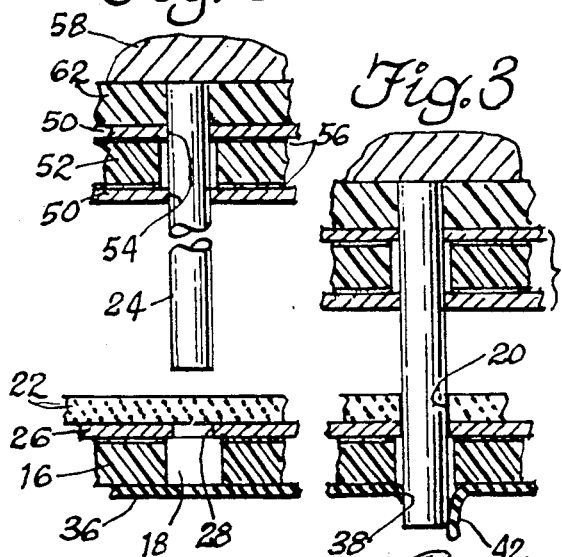
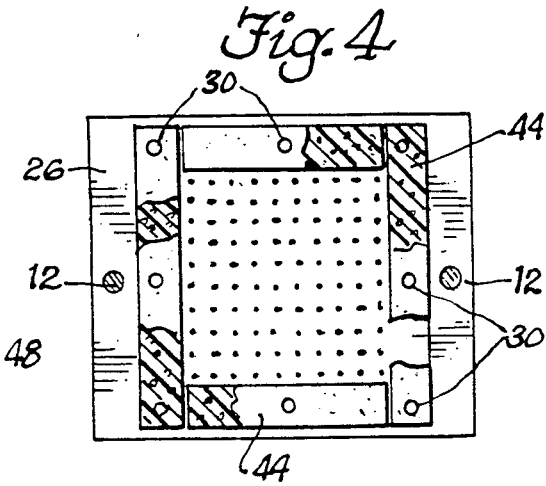
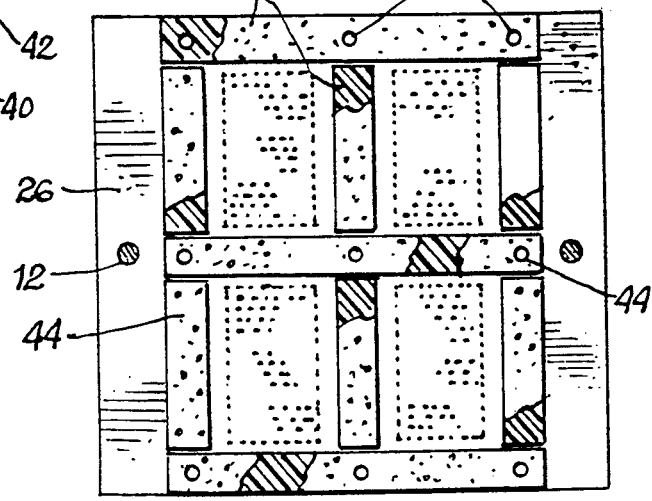
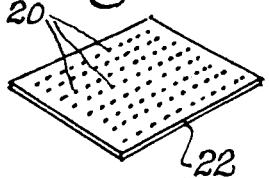

1

VIA HOLE PUNCH

BACKGROUND OF THE INVENTION

The invention is in the field of microelectronics, and in particular relates to creating "via holes" in thin ceramic wafers. The via holes in the wafers are subsequently filled with a conductive ink and stacked to be used in integrated circuits. The desired end result is an extremely dense integrated circuit.

One of the major current thrusts in leading edge electronics technology is the continued micro-miniaturization of all circuitry to bring components closer together, minimizing electronic reaction time between components and further speeding up the action of the system.

Three-dimensional circuitry has long been used in integrated circuits to minimize distance between components. Typically, these IC's are made of a stack of up to twenty insulating wafers, each having a pattern of via holes different from the others, with circuitry being screened on at least one side of each wafer to define current paths through the via holes and then laterally between insulating wafers through the interstitial circuitry to connect to other via holes.

As integrated circuits have become more and more condensed, efficiently producing the insulating ceramic wafers with the appropriate pattern of minute via holes has become more expensive and complex. If feasible, mechanically drilling the hole pattern for the punch pins into the punch mount is the most efficient and practical techniques. As the via holes are made smaller and smaller however, creating the punch mount which mounts the thousands of punch pins which punch the via holes in the wafers becomes more difficult. Computer operated mechanical drilling systems can economically produce holes down to about 10 mils but below that size, mechanical drilling becomes impractical. Via holes between 5 and 8 mils are currently the state of the art. Providing the mounting holes in a punch mount for these narrow diameter pins, as well as the corresponding punch-receiving hole pattern in the die plate and creating a die for producing very small closely packed via holes is the problem which this invention addresses.

SUMMARY OF THE INVENTION

The die of the instant invention utilizes a combination of photochemical etching and mechanical drilling to produce the holes in the hole pattern necessary both to mount the punch pins and to provide the corresponding hole pattern in the die punch plate.

The punch pin pattern is mounted in a sandwich of two very thin layers of machineable material such as brass or aluminum, as little as 1 mil thick. These two sheets sandwich a thicker slab of G-10 fiberglass circuit board material or the equivalent between them. The thin outer sheets have the punch pin hole pattern photoetched identically into both of them, and the spacing slab between these sheets has a hole pattern identical to that of the two outer sheets, but of a larger diameter so that it can be mechanically drilled. The sheets are bonded to the slab with the holes of all three layers axially aligned, with the punch pins then being inserted into the holes and bonded above the sandwich with a layer of epoxy.

The die plate mount created in this fashion is then pressed down against a die subplate having the corresponding hole pattern of larger diameter, mechanically drilled holes, covered with a thin skin of material having the smaller diameter holes of the hole pattern photoetched through the skin to match the diameter of the punch pins.

BRIEF DESCRIPTION OF THE DRAWINGS

FIG. 1 is a section taken vertically through the die;

FIG. 2 is an enlarged fragmentary section of portion of a punch mount illustrating the mounting of one punch pin and its relation to the underlying die plate which supports a ceramic wafer to be punched;

FIG. 3 is identical to FIG. 2 except that the punch and die plate are shown at the end of the punching stroke;

FIG. 4 is a section taken along line 4—4 of FIG. 1;

FIG. 5 is a plan view of a die plate and wafer layout identical in principal to the other Figures but showing a different wafer configuration; and, FIG. 6 is a perspective view illustrating a finished wafer having the predetermined pattern of via holes punched therein.

DETAILED DESCRIPTION OF THE PREFERRED EMBODIMENT

The overall die is shown in FIG. 1. It has a rigid base 10 which supports indexing and guide posts 12 on which the die set 14 is removably mounted to be slidable in a very precise fashion.

The base 10 also supports a die plate 16. The die plate is made of an inexpensive, machineable material, which would ordinarily be G-10 fiberglass used in circuit board construction. The die plate is provided of a hole pattern consisting of holes 18 that are mechanically drilled. The drilling of the die plate can be done quickly and inexpensively with a computer controlled drilling unit which can be instantly changed to drill a different hole pattern by changing the pattern program. The holes 18 of the die plate are a minimum of 10 mils in diameter, and would typically be about 13 mils. This is a diameter that is handled with a computer controlled drill system in a non-problematic fashion.

The holes 18 of the hole pattern in the die plate are larger than the via holes 20 that must be punched into the wafer 22. They are too large to provide for the appropriate sheer for the punch pins 24. Therefore, the die plate is covered with a thin skin 26 which is bonded to the top and which has a hole pattern consisting of holes 28 which are the appropriate size to receive the punch pins 24, typically about 1 mil wider than the punch pins. The die plate and its top skin are indexed on the guide posts 12, and the die plate also mounts a set of peripheral locator pegs 30 which index the wafer 22 while it is being punched. The peripheral area of the wafer 22 which have the locator holes 32 for the locator pegs will become scrap when the wafer is punched and the usable central portion or portions, in the case of a multiple sector wafer shown in FIG. 5, is cut out of the overall wafer as illustrated in FIG. 6.

The punch pins 24 may have a diameter on the order of 5 to 8 mils, with the holes 28 being correspondingly slightly wider. Holes of this diameter are not practical to produce in the drilling process that is used to create the die plate holes 18. Therefore, the hole pattern in the skin atop the die plate is created with a photoetching process, which is well known in the electronics art and is used extensively in different variations for creating circuits. The skin 26 would typically be made of brass, stainless steel or aluminum, and have a thickness of between 1 and 5 mils. The holes etched through the skin can be made fairly clean and uniform using materials of this thickness, which is thin enough to be considered metal foil.

The wafer 22 as indicated above is indexed on the pegs 30 positioned around its periphery. It is also held down by a vacuum created in a vacuum chamber 34 connected to an evacuation system, not shown. The vacuum may access the wafer through holes provided throughout the die plate and skin which are not aligned with the punch holes, and also pulls a vacuum through the stripper layer 36 which has an opening in the form of a small slit 38 beneath each of the die plate holes 18 so that as the plugs 40 are punched from the ceramic wafer, the flap 42 of the stripper layer flicks the plug off the end of the punch.

As indicated, the die set 14 slides in a very controlled and precise fashion up and down on the guide posts 12. It is supported above the die plate by a resilient spacer 44, which could be defined around the entire perimeter of the die set and the wafer as shown in the Figures, or could be used only at spaced points along the periphery. The spacer 44 holds the die set 14 in the position illustrated in FIG. 1 when the die is not being used. Ordinarily it is made of a foam material that will compress adequately to permit the punch pins to be pressed down at least as far as illustrated in FIG. 3.

The actual punch mount 14 of the die set is based around a three-layer sandwich 48 comprised of two outer sheets 50 and an inner spacer slab 52. The spacer slab 52 is on the order of 0.062 inches thick, as is the die plate 16. The spacer slab and the die plate 16 are substantially identical in construction, having the same hole pattern, the same thickness, and the same hole diameter, and both being made of G-10 fiberglass or the equivalent. The outer sheets 50 which form the sandwich are similarly substantially identical to the skin 26 in all respects. Like the skin, they vary in thickness from 1 to 5 mils, and have holes 54 photoetched in the same pattern and in the same manner as the skin. Typically, the two sheets and the skin 26 are identical and interchangeable parts.

The two sheets are bonded to the spacer slab at 56. The bonding material can be simple contact cement. Clearly it is very important that the holes in the 3 layers of the sandwich are axially aligned and the aggregate of the axes are parallel to support the punch pins as parallel to one another as possible.

The manner in which the die set is produced is as follows. The sandwich 48 is created, and a block similar to aluminum block 58 is used which defines a well 60. The well-defining block is either made of teflon TM or coated with teflon TM so that epoxy will not permanently bond to it, and the well-defining member is turned up side down from the orientation shown in FIG. 1. The well 60 is then filled with epoxy.

The pin mounting sandwich 48 has the punch pins 24 pressed through each hole in the predetermined hole pattern, and the sandwich, with the pins protruding through what is the top sheet in FIG. 1, is then laid down across the epoxy-filled well 60, in the up-side down position from that shown in FIG. 1, with the extending pins immersed in the still wet epoxy. A rigid, flat sheet is then pressed against what would be the bottom of the pins in Figure so that each pin is flushly pressed against the material backing the well 60. When the epoxy dries, the well-defining member is removed from the epoxy mass 62, such that all punch pins are uniformly mounted and extend downwardly, when mounted with the rest of the die, a uniform distance. The well-defining member is then replaced with the aluminum block 58. Gravity will hold the block in place, so that it is easily removed from the punch mount 46, to accept punch mounts having different pin configurations.

The punch pins 24 are cut from steel wire of the appropriate diameter and are inexpensively produced and relatively easy to quality control. A stack of wafers of up to 20 would of course have different hole pattern in each wafer, and thus require a different punch mount with punch pins in a different pattern, together with a corresponding die plate 14.

Thus, with 20 different sets of punches and die plates, production cost becomes critical. The unit described in this specification can be produced for about $500 to $2,000 per unit. It will produce approximately 1,000 punched wavers before the punch mount must either be replaced, or the punches sharpened.

This compares to a typical cost of about $85,000.00 to produce a similar set of dies die using techniques that are currently standard in the industry. This enormous cost savings of using the technology disclosed herein not only produces less expensive parts, but also makes it economical to produce a much wider variety of large scale integrated circuits which are not produced in the mass quantities that are required to make production possible using current punch production techniques.

It is hereby claimed:

1. A die for producing a multiplicity of minute via holes in a wafer comprising:
   (a) a base for supporting a horizontal die plate and mounting vertically extended upright guide posts;
   (b) a die set vertically slidable over said guide posts;
   (c) said die plate having a pre-punched predetermined hole pattern of die holes therethrough and including a skin overlying said die plate having an identical pre-punched predetermined hole pattern of skin holes therein, but each skin hole being smaller than said die holes such that each die hole is overlaid by a smaller skin hole in said skin; and,
   (d) said die set mounting a multiplicity of depending vertical punch pins arranged corresponding to said predetermined hole pattern and dimensioned to snugly slide into said skin holes and punch said predetermined hole pattern into a wafer positioned on said die plate.

2. Structure according to claim 1 wherein said skin holes are less than 10 mils in diameter and are photoetched.

3. Structure according to claim 2 wherein said skin is a machineable metal and said die plate is made of G-10 fiberglass.

4. Structure according to claim 1 and including a resilient stripper sheet bonded to the underside of said die plate and having an opening defined beneath each die plate hole to receive a descending punch extended therethrough and strip a plug from the end of a punch as it retracts up through the respective opening in the die plate.

5. Structure according to claim 4 wherein said opening in said stripper sheet is in the form of a slit.

6. Structure according to claim 1 and including a vacuum chamber defined beneath said die plate and connected to a vacuum source to hold a wafer compressed against the top of said skin overlying said die plate and to help hold said skin against said die plate.

7. Structure according to claim 1 wherein said die set includes a multi-layered punch mount comprising two substantially identical horizontal parallel spaced punch mount sheets each defining said predetermined hole pattern with the holes in said sheets being vertically aligned between the sheets to define a multiplicity of spaced aligned hole pairs, and a spacer slab sandwiched between said punch mount sheets and being bonded thereto, said spacer slab having a hole between the holes of each of said hole pairs, but of larger diameter, and said multiplicity of punch pins each being engaged in one of said hole pairs.

8. Structure according to claim 7 wherein said punch pins extend above the upper one of said punch mount sheets and including a mass of bonding agent bonding the portions of said pins extending above the upper one of said punch mount sheets to the upper one of said punch mount sheets.

9. A method of constructing a die capable of punching a multiplicity of minute via holes in a predetermined pattern in a wafer lying on a die plate having holes of said predetermined hole pattern therein, comprising the following steps;
(a) photoetching holes according to said predetermined hole pattern into two etchable sheets which are thin enough to be etched completely through to produce holes according to said hole pattern with the holes being of a first diameter;
(b) creating holes of a second diameter according to said predetermined hole pattern in a spacer slab with said second diameter being greater than said first diameter;
(c) sandwiching said slab between said sheets such that the respective holes in said predetermined hole patterns in said sheets and slab align to form a multiplicity of aligned hole sets, and bonding said sheets to said slab to create a sandwich;
(d) inserting a punch pin into each of said aligned hole sets; and,
(e) bonding said punch pins to said sandwich.

10. A method according to claim 9 said holes of said first diameter are photoetched and said first diameter is less than 10 mils.

11. A method according to claim 9 wherein the holes in said die plate are larger than said first diameter and including the step of photoetching holes of substantially said first diameter in a photoetchable skin according to said predetermined hole pattern and bonding said skin to the upper surface of said die plate such that the predetermined hole pattern of said die plate registers with the predetermined hole pattern of said skin.

12. A method according to claim 9 wherein said sandwich has a top side and a bottom side, and step (d) includes inserting said punch pins through said sandwich such that they define top ends extending beyond said top side, and step (b) comprises substantially filling the well of a well-defining member with a solidifying bonding liquid, and placing said sandwich upside-down over said well-defining member such that the top ends of said push pins extend into said well, and allowing said bonding agent to solidify into a solid mass.

13. Structure according to claim 12 wherein said bonding agent is epoxy, said well is defined of a material that will not bond with epoxy, and including the further step of removing said well-defining member from said mass after said epoxy solidifies.

14. A method according to claim 13 and including the further steps of mounting said epoxy mass after it solidifies in a permanent block.

15. A method according to claim 12 wherein said punch pins are of substantially the same length and said well has a flat bottom and including the step of pressing all of said punch pins into contact with said flat bottom such that all of said punch pins extend from the bottom side of said sandwich substantially the same distance.

* * * * *